US010746780B2

(12) United States Patent
Xie et al.

(10) Patent No.: US 10,746,780 B2
(45) Date of Patent: Aug. 18, 2020

(54) HIGH POWER TERAHERTZ IMPULSE FOR FAULT ISOLATION

(71) Applicant: Intel Corporation, Santa Clara, CA (US)

(72) Inventors: Mayue Xie, Phoenix, AZ (US); Simranjit S. Khalsa, Chandler, AZ (US); Hemachandar Tanukonda Devarajulu, Chandler, AZ (US); Deepak Goyal, Phoenix, AZ (US); Zhiguo Qian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 15/776,979

(22) PCT Filed: Nov. 18, 2015

(86) PCT No.: PCT/US2015/061303
§ 371 (c)(1),
(2) Date: May 17, 2018

(87) PCT Pub. No.: WO2017/086948
PCT Pub. Date: May 26, 2017

(65) Prior Publication Data
US 2018/0335465 A1 Nov. 22, 2018

(51) Int. Cl.
*G01R 31/11* (2006.01)
*G01R 31/28* (2006.01)
*G01R 31/311* (2006.01)

(52) U.S. Cl.
CPC .......... *G01R 31/11* (2013.01); *G01R 31/2853* (2013.01); *G01R 31/2896* (2013.01); *G01R 31/311* (2013.01)

(58) Field of Classification Search
CPC ................ G01R 31/11; G01R 31/2896; G01R 31/2853; G01R 31/311
(Continued)

(56) References Cited

U.S. PATENT DOCUMENTS 5,266,901 A    11/1993    Woo
5,430,292 A *  7/1995    Honjo ...................... G03F 1/86
                                                         250/310
(Continued)

FOREIGN PATENT DOCUMENTS

WO    WO-2017086948 A1    5/2017

OTHER PUBLICATIONS

"International Application Serial No. PCT/US2015/061303, International Search Report dated Aug. 29, 2016", 3 pgs.
(Continued)

*Primary Examiner* — Giovanni Astacio-Oquendo
(74) *Attorney, Agent, or Firm* — Schwegman Lundberg & Woessner, P.A.

(57) ABSTRACT

An apparatus comprises a signal generator circuit, a test probe, a signal sensor circuit, and a defect detection circuit. The signal generator circuit is configured to generate an impulse test signal having an impulse waveform and adjust a bandwidth of the impulse test signal. The test probe is electrically coupled to the signal generator circuit and configured to apply the impulse test signal to a device under test (DUT). The signal sensor circuit is configured to sense a conducted test signal produced by applying the impulse test signal to the DUT with the test probe. The defect detection circuit is configured to generate an indication of a defect in the DUT using the conducted test signal.

23 Claims, 18 Drawing Sheets

(58) Field of Classification Search
USPC .................. 324/533, 532, 527, 512, 500
See application file for complete search history.

(56) References Cited

U.S. PATENT DOCUMENTS

| | | | |
|---|---|---|---|
| 5,751,149 A | 5/1998 | Oberg et al. | |
| 6,144,210 A | 11/2000 | Brooks | |
| 6,184,690 B1 | 2/2001 | Fisher | |
| 6,459,268 B1 * | 10/2002 | Lutz | G01R 31/3278 |
| | | | 324/418 |
| 7,075,307 B1 | 7/2006 | Williamson | |
| 2006/0076503 A1 * | 4/2006 | Tsao | H01J 37/228 |
| | | | 250/396 R |
| 2006/0273263 A1 * | 12/2006 | Raymond | G01B 11/0616 |
| | | | 250/492.2 |
| 2008/0318467 A1 * | 12/2008 | Denomme | H01R 31/08 |
| | | | 439/511 |
| 2010/0176830 A1 * | 7/2010 | Watson | G01R 31/3278 |
| | | | 324/756.05 |

OTHER PUBLICATIONS

"International Application Serial No. PCT/US2015/061303, Written Opinion dated Aug. 29, 2016", 10 pgs.

* cited by examiner

PIN 1

US 10,746,780 B2

HIGH POWER TERAHERTZ IMPULSE FOR FAULT ISOLATION

CLAIM OF PRIORITY

This patent application is a U.S. National Stage Application under 35 U.S.C. 371 from International Application No. PCT/US2015/061303, filed Nov. 18, 2015, published as WO 2017/086948, which is incorporated herein by reference.

TECHNICAL FIELD

Embodiments pertain to testing of integrated circuits or ICs. Some embodiments relate to detecting defects in multichip modules (MCMs).

BACKGROUND

The demand for increased functionality in small consumer electronic products such as smartphones and tablet computers continues the drive to decreased feature sizes of integrated circuits (ICs) and increased complexity of electronic packaging. For example, current electronic packaging can include, among other things, embedded silicon bridge multi-chip modules (MCMs) and package on package (PoP) multidimensional packaging in which multiple integrated circuit dice can be packaged horizontally and vertically. The packaged components can include one or more processors, memory such as dynamic random access memory (DRAM), and analog circuits such as radio frequency (RF) circuits and other special function devices. These advanced packaging technologies provides challenges to manufacturers of ICs, including testing, debug, and failure analysis of the devices in these complex electronic packages.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As explained previously herein, advanced electronic packaging technologies provide challenges to manufacturers. One of the challenges is to identify the failing component for a defective or non-functional packaged device. This allows faulty components to be replaced and allows for analysis of the manufacturing process to identify the source of the problem. Traditional methods have relied on destructive analysis to identify which component is defective. However, destructive analysis is slow and causes higher yield cost.

Time domain reflectometry (TDR) is a technology that can be used to determine the condition of electrical conductors such as electrically conductive lines or paths of an electronic device. A step function waveform is typically provided to a conductor using a probe and the signal reflected back to the probe from the device is analyzed to determine the condition of the conductor. The waveform of the reflected signal can provide information of the condition of the conductor. For instance, the shape of the reflected signal waveform for a functional part will be different from the waveform of a part having a short or open in the conductor. A problem with conventional TDR is that a step function does not provide the resolution necessary to isolate defects as the structures to be tested continue to become more complicated.

Electro-optic time domain reflectometry (EOTPR) is another approach to defect isolation in integrated circuits. An optical signal is provided to an electro-optic probe where the optical signal is converted to an electrical signal which is applied to a device under test (DUT). A defect in the DUT reflects a signal that affects an electro-optic crystal at the electro-optic probe. For instance, an optical sampling signal provided to the electro-optic probe may experience a change in polarization due to a reflected electrical signal incident to the electro-optic crystal. Analysis of the polarized optical sampling signal can provide information on the location of defects in the DUT. EOTPR uses a fermi-second laser pulse to generate an electrical test signal that includes terahertz electric pulses. Pulses reflected by the DUT are detected in the optical sampling signal. EOPTR may provide a better signal than the TDR approach to apply to a complicated electronic assembly to isolate defects. However, EOPTR is expensive and the EOPTR signals may attenuate too quickly for proper testing of complex electronic packages.

Figure 1:
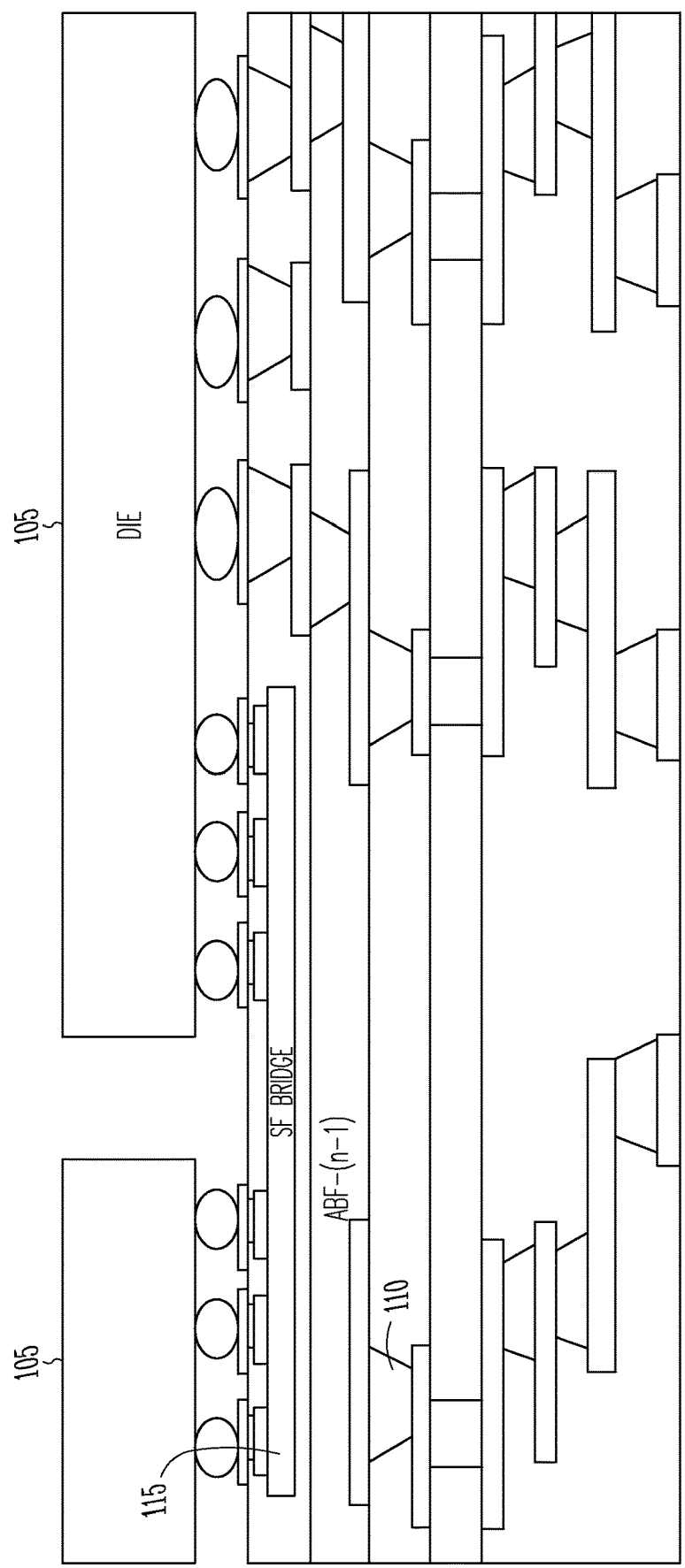
FIG. 1 illustrates an example of portions of a complex electronic package.

FIG. 1 illustrates an example of portions of a complex electronic package. The example shows that a complex package may include, among other things, multiple IC dice 105 in addition to multiple vias 110, and may include one or more embedded interconnect bridge structures such as silicon (Si) bridge structures. A Si bridge 115 can be very lossy for a high frequency signal, and conventional technology may have difficulty detecting the defect location; especially if the SI bridge is long and includes multiple Si bridge metal lines chained together.

Figure 2:
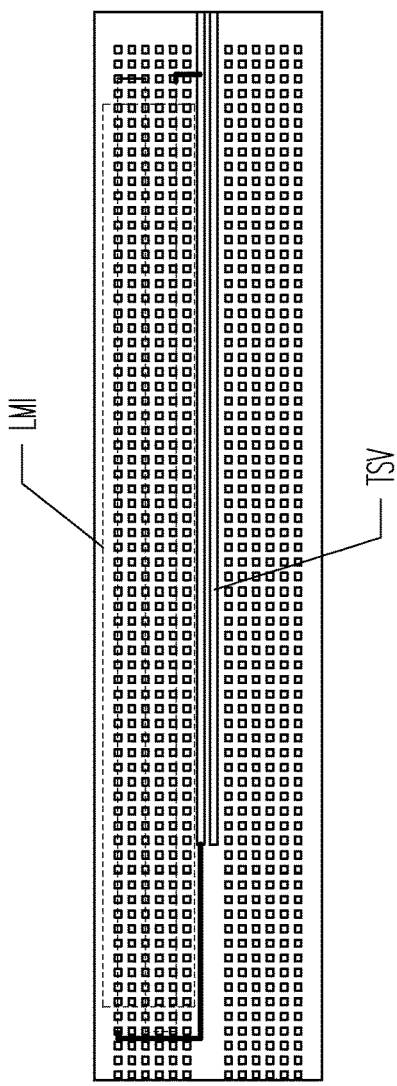
FIG. 2 illustrates another example of portions of a complex electronic package.
Figure 2:
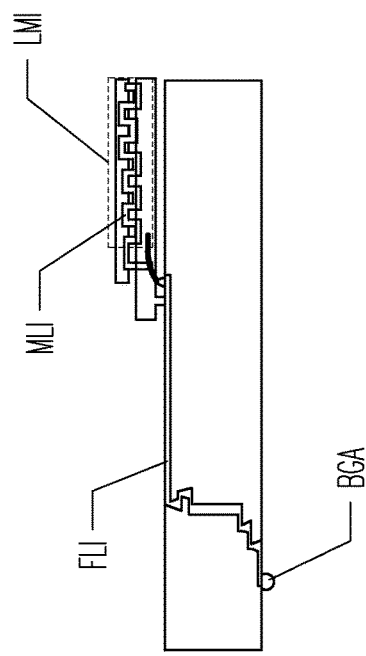

FIG. 2 illustrates another example of portions of a complex electronic package. The example includes first level interconnect (FLI) and midlevel interconnect (MLI). The MLI includes through silicon vias (TSVs) and a redistribution layer (RDL) having metal traces. One or both of TSVs and RDLs may be connected together to form daisy chained structures, such as one or both of TSV daisy chains and logic-memory interconnect (LMI) daisy chains. Conventional technology may have difficulty detecting the defect location non-destructively due to the sense silicon and metal lines. Conventional EOPTR and TDR approaches have difficulty in isolating failures over the necessary distances due to the fast signal decay inside the silicon/metal structures.

Figure 3:
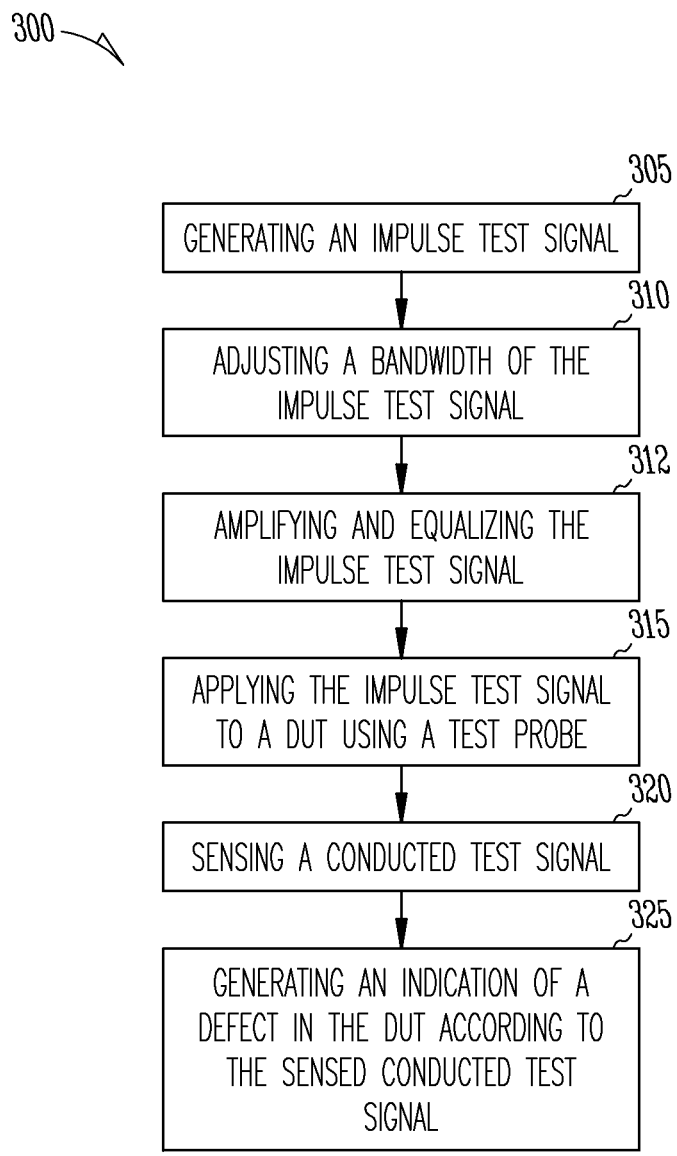
FIG. 3 is a flow diagram of an embodiment of a method of controlling operation of a testing device.

FIG. 3 is a flow diagram of an embodiment of a method 300 of controlling operation of a testing device to isolate defects in a device under test (DUT), such as a multi-chip electronic package for example. At 305, an impulse signal is generated. The impulse signal can be an electrical signal having an impulse function waveform. In some embodiments, the impulse signal is generated by first generating a step function test signal and producing the impulse test signal from the step function test signal.

Figure 4A:
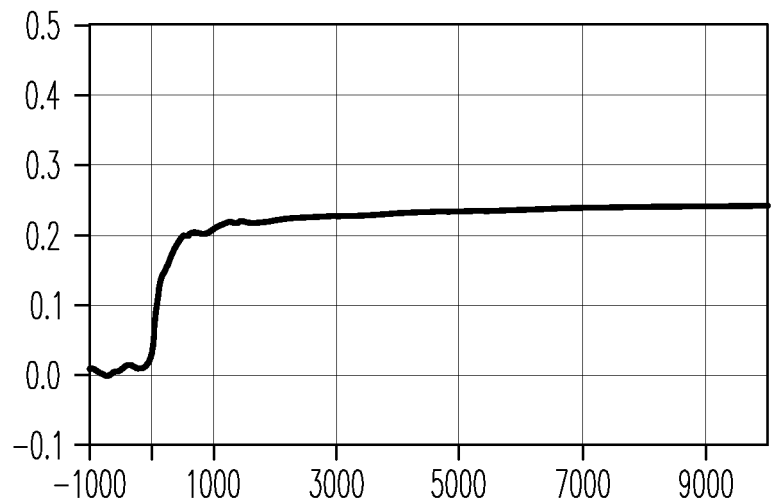
FIGS. 4A, 4B are graphs to illustrate an example of generating an impulse test signal.
Figure 4B:
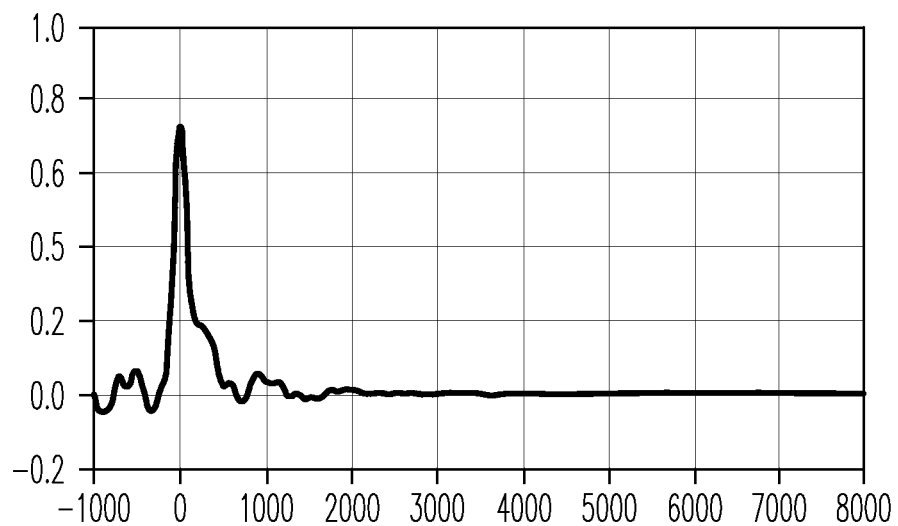

FIGS. 4A and 4B are graphs to illustrate an embodiment of generating an impulse test signal. FIG. 4A shows an example signal having a step function waveform, and FIG. 4B shows an example signal having an impulse function waveform. The impulse signal of FIG. 4B can be generated by producing the time derivative of the step function signal of FIG. 4A and amplifying the resulting time derivative (e.g., amplifying three times or 3×). In certain embodiments, the time derivative can be produced using software, such as by using digital signal processing (DSP). In certain embodiments, the time derivative can be produced using hardware circuits. The software or hardware may implement the function:

$$V(\text{out}) \approx (Tc)(dV(\text{in})/dt),$$

where $dV(\text{in})/dt$ is the time derivative of the voltage of the input step function and Tc is a coefficient of the time derivative.

Returning to FIG. 3 at 310, a bandwidth of the impulse test signal is adjusted. FIG. 4A shows that, unlike an idealized step function waveform, in practice a step function waveform includes some finite slope. When producing the impulse function waveform from the time derivative of the step function waveform, changing the slope of the step function waveform of 4A changes the bandwidth of the impulse function waveform of FIG. 4B. For instance, a slower slope in the step function leads to a wider bandwidth in the impulse function. Thus, the bandwidth of the impulse test signal can be adjusted by adjusting the slope of the step function waveform of the step function test signal. At 312, the impulse test signal may be amplified in certain embodiments to increase signal strength to reach defects in long chains of electronic device features. In certain embodiments, the impulse test signal may be equalized to optimize the shape and bandwidth of the impulse test signal to increase localization of defects in the long chains.

At 315, the impulse test signal is applied to the DUT using a test probe. The impulse test signal may be applied to a conductive structure (e.g., a metal trace or die pad) of a complex electronic package. At 320, a conducted test signal is sensed. The conducted test signal is produced from applying the impulse test signal to the DUT and sensing a resulting signal that is conducted through at least a portion of the DUT.

Figure 5:
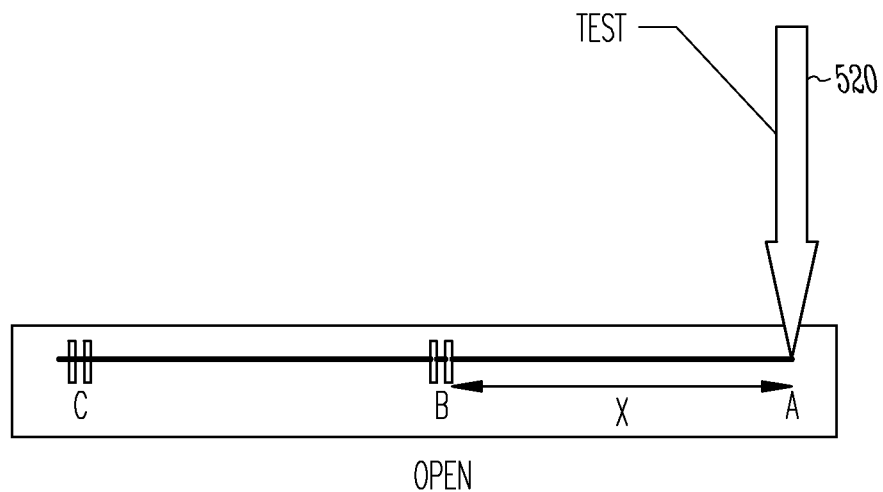
FIG. 5 illustrates an embodiment of sensing a conducted test signal.
Figure 6:
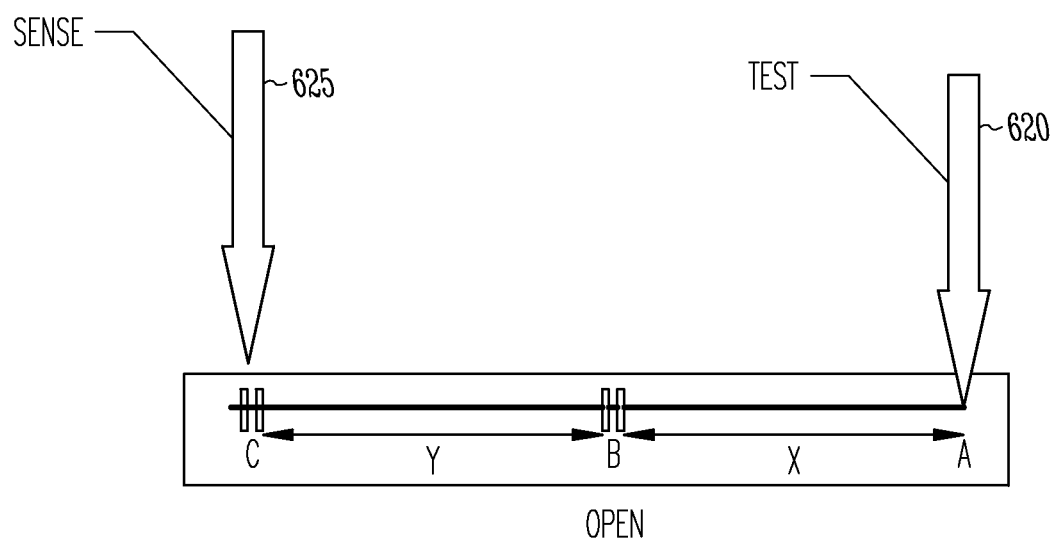
FIG. 6 illustrates another embodiment of sensing a conducted test signal.

FIG. 5 illustrates an example of sensing the conducted test signal. The impulse test signal is applied at location "A" using the test probe 520. The applied signal may be reflected from location "B," and the conducted test signal can be a reflected signal of the applied impulse test signal sensed using the test probe 520. FIG. 6 illustrates another example of transmitting a test signal and then sensing the test signal conducted in the DUT. The impulse test signal is applied at location "A" using the test probe 620. The conducted test signal is sensed at location "C" using a sense probe 625.

Returning to FIG. 3 at 325, an indication of a defect in the DUT is generated using the conducted test signal. In some variations the indication may be that the electronics package includes a defect in the path taken by the conducted test signal, and in some variations the indication may include the location of the defect.

Figure 7:
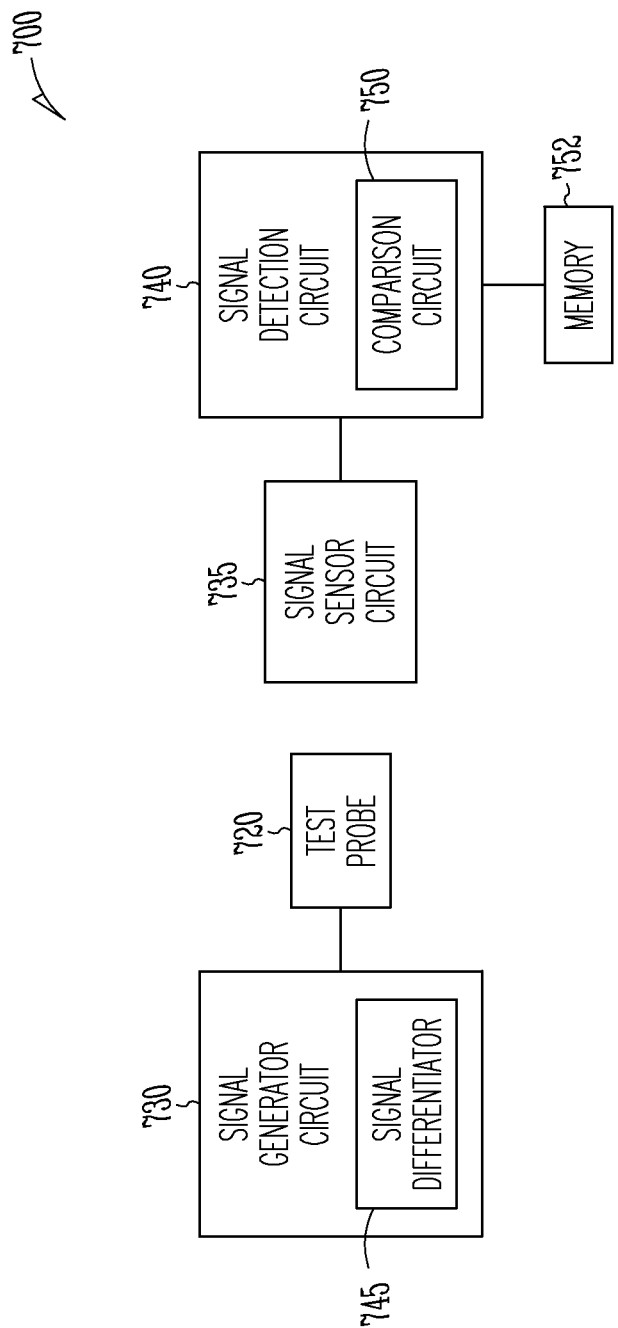
FIG. 7 is a block diagram of an embodiment of a device to locate or isolate defects in a device under test.

FIG. 7 is a block diagram of an embodiment of a device to locate or isolate defects in a DUT. The device 700 includes a signal generator circuit 730, a test probe 720, a signal sensor circuit 735, and a defect detection circuit 740. The signal generator circuit 730 generates the impulse test signal having an impulse waveform. The bandwidth of the impulse test signal can be adjusted by the signal generator circuit 730. In some embodiments, the signal generator circuit 730 includes a signal differentiator 745. In the embodiments, the signal generator circuit 730 may first generate a step function test signal having a step function waveform function. The signal differentiator 745 generates the impulse test signal from a time derivative of the step function test signal (e.g., $dV(\text{in})/dt$ where $V(\text{in})$ is a step function signal). The signal differentiator 745 can include hardware, software, or firmware, or any combination of hardware, software, and firmware to perform the functions described. The signal generator circuit 730 may adjust the slope of the step function waveform of the step function test signal to set the bandwidth of the impulse test signal.

The test probe 720 can be electrically coupled to the signal generator circuit 730 and applies the impulse test signal to the DUT. The signal sensor circuit 735 senses a conducted test signal produced by the impulse test signal being applied to the DUT. The defect detection circuit 740 generates an indication of a defect in the DUT using the conducted test signal. The defect detection circuit 740 may include a comparison circuit 750. In some embodiments, the comparison circuit 750 is used to compare the sensed reflected signal to a reference reflection signal expected from a DUT without defect, and generates the indication of the defect according to the comparison. A representation of the reference signal may be stored in memory 752 of the device.

Figure 8:
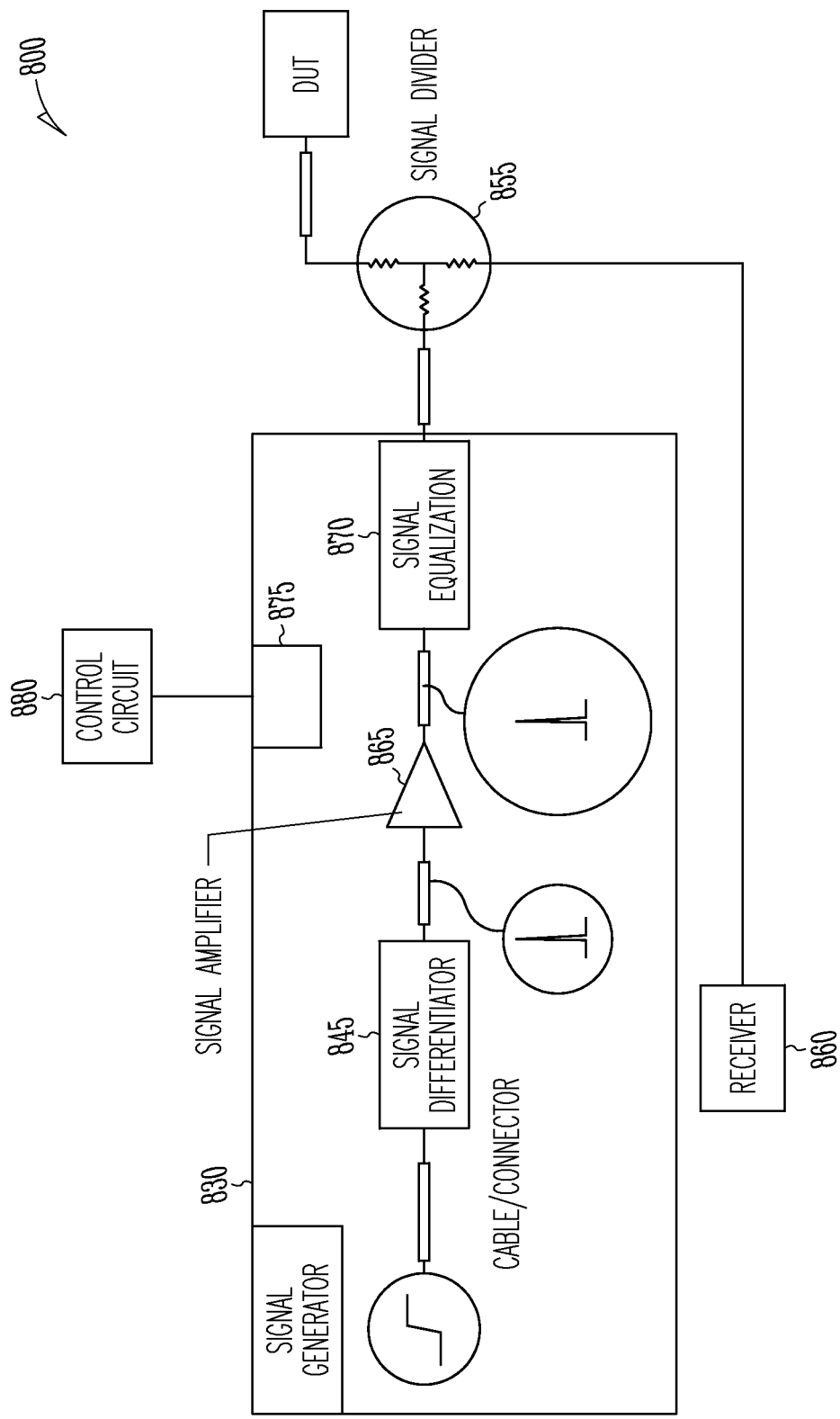
FIG. 8 is a block diagram of portions of another embodiment of a device to isolate defects in a device under test.

FIG. 8 is a block diagram of portions of another embodiment of a device to isolate defects in a DUT. In the embodiment, the sensed conducted test signal is a reflected signal of the applied impulse test signal. The device 800 includes a signal generator circuit 830 that produces the impulse test signal. In some examples, the signal generator circuit 830 generates an impulse in the impulse test signal that has a pulse-width less than twenty picoseconds (ps). The signal generator circuit 830 may include a signal differentiator 845, and the signal generator circuit 830 may convert a step function signal having a step function waveform into the impulse test signal having an impulse function waveform. The impulse test signal is applied to the DUT using a test probe and the reflected signal is sensed with the test probe. The device may include a signal divider circuit 855 to route the impulse test signal to the DUT and route the sensed conducted signal to a signal sensor circuit at the signal receiver 860.

Figure 9:
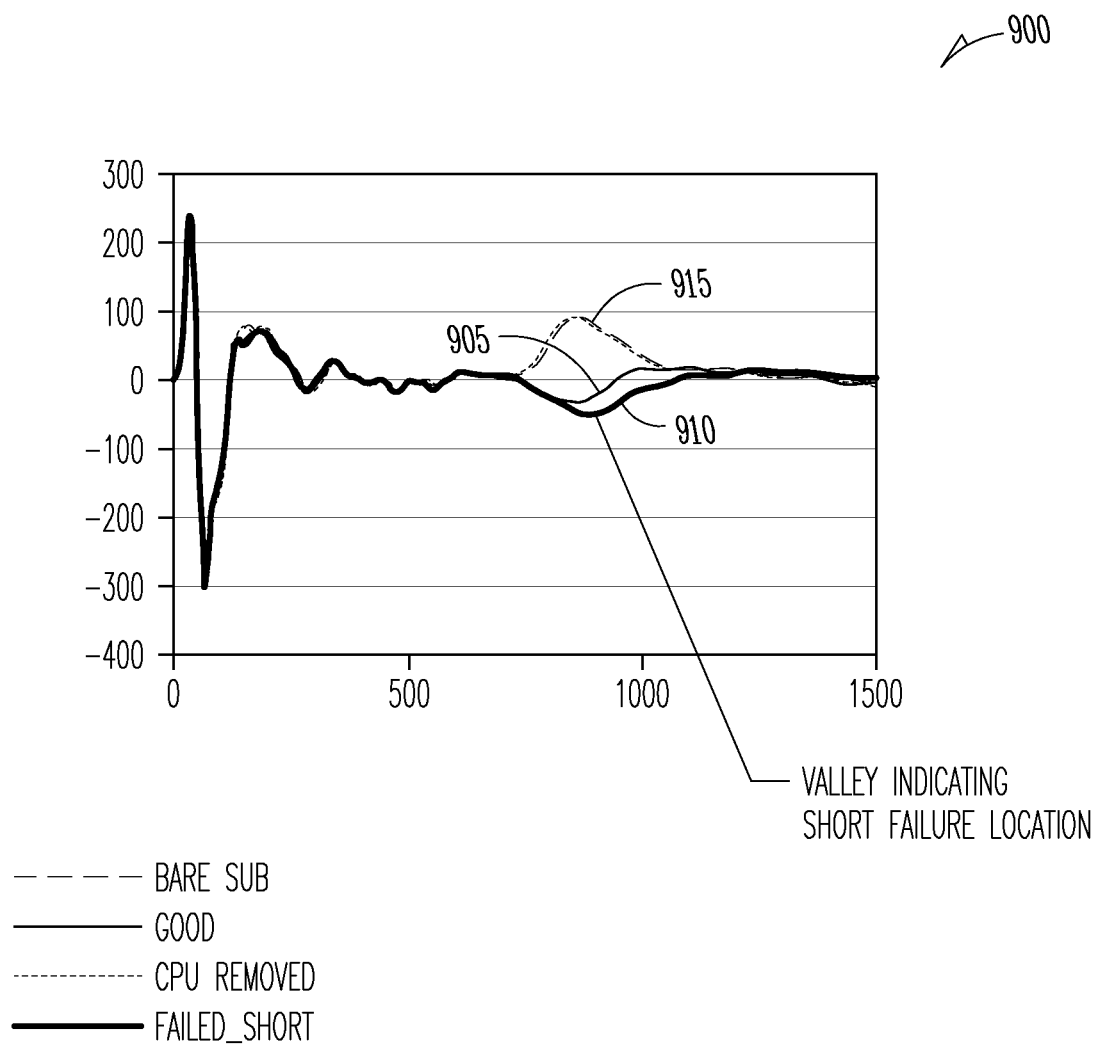
FIG. 9 is a graph of an example of a sensed reflected signal waveform.

FIG. 9 is a graph 900 of an example of a sensed reflected signal waveform. In the example, an impulse test signal was applied to a solder bump of an electronic package using a test probe and the reflected signal was sensed using the test probe. The graph 900 shows three waveforms. The middle waveform 905 is a waveform representative of a device without defect. The bottom waveform 910 is representative of a device having a defect causing an electrical short in the device. The short is evident by the deeper valley in the bottom waveform 910 than in the middle waveform 905. The top waveform 915 is representative of a device having a defect causing an open circuit in the device.

In some embodiments, a comparison circuit may be used to compare a sensed reflected signal waveform to a reference signal waveform. The device 800 may include memory to store a representation of a template reflection signal expected from a DUT without defect as the reference signal waveform. The comparison circuit may include a signal processor that compares sampled values of the sensed reflected signal waveform to the values of the reference signal waveform. The comparison circuit may detect a defect when the sampled values of the sensed signal differ from the sampled values of the reference signal waveform by more than specified threshold signal difference.

In some embodiments, the comparison circuit detects the time position in the sensed waveform where the sensed reflected signal waveform differs from the reference signal waveform. The time position of the detected difference can be used by a defect detection circuit to determine the distance of the defect from the probe point. For the example of FIG. 9, testing found that the location of the defect could be isolated to within thirty micrometers (30 μm) using the detected time position of the waveform difference.

Figure 10A:
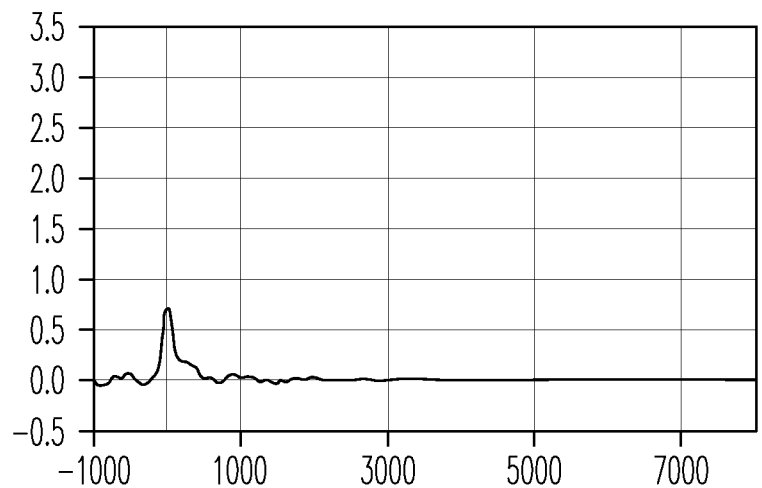
FIGS. 10A, 10B shows an embodiment of a test signal generated by taking the time derivative of a step function.
Figure 10B:
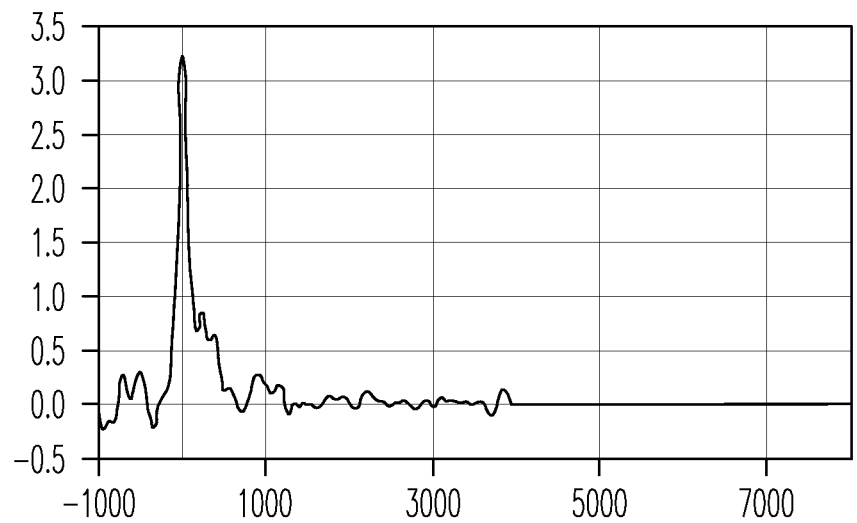
Figure 11:
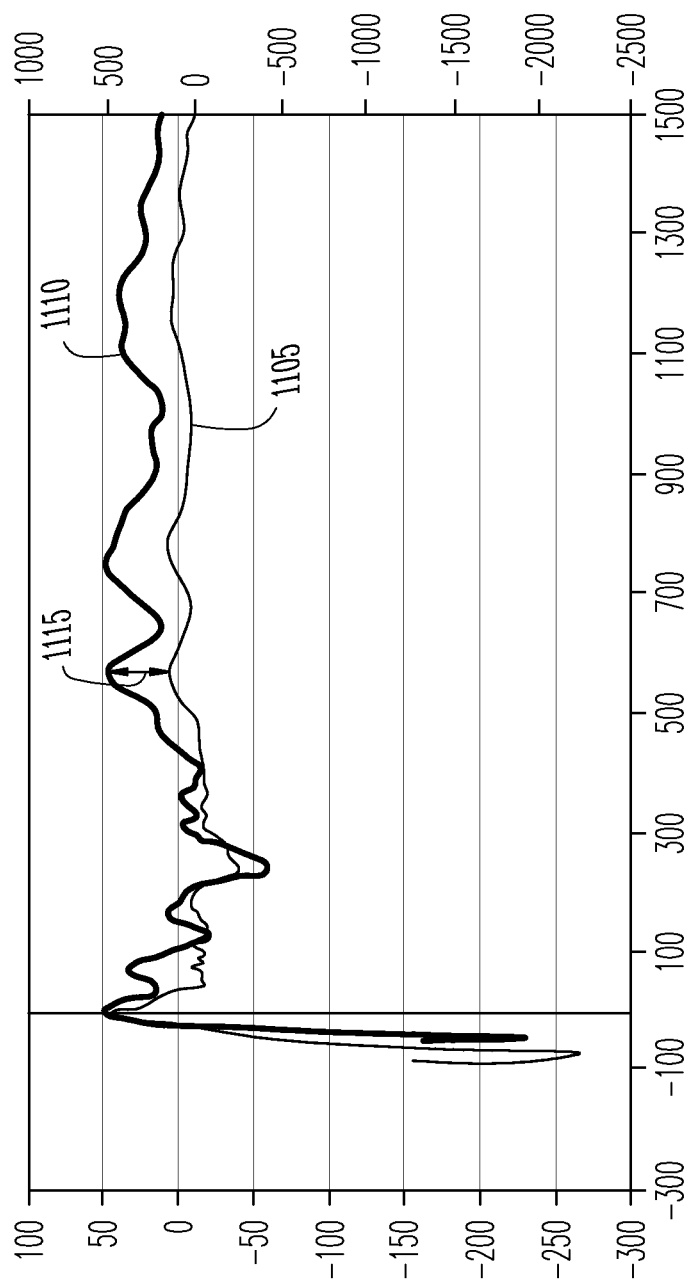
FIG. 11 is a graph showing sensed test signal waveforms.

Returning to FIG. 8, the signal generator circuit 830 may also include an amplifier circuit 865 to increase the signal power of the impulse test signal to produce an amplified impulse test signal. Increasing the signal power may increase the travel distance of the impulse test signal through the DUT. FIGS. 10A and 10B are graphs of an example of an impulse test signal. FIG. 10A shows an example of a test signal generated by taking the time derivative of a step function. FIG. 10B shows the signal of 10A amplified to four times the amplitude of the original signal. Additionally, increasing the signal power may make device defects more readily apparent in the sensed conducted signals. FIG. 11 is a graph showing a first sensed signal waveform 1105 and a second sensed signal waveform 1110. The first signal waveform is generated using a lower power impulse test signal and the second signal waveform 1110 is generated using a higher power impulse test signal. A comparison of the two signal waveforms shows that the device defects such as electrical discontinuity at time 1115 are more apparent when using the higher power impulse test signal.

Bandwidth can be another approach to address test signal attenuation. A test signal with a narrow bandwidth may attenuate less quickly than a test signal with a wider bandwidth. For this reason, the signal generator circuit 830 may include an equalizer circuit 870 to optimize the shape and bandwidth of the impulse test signal in the amplified impulse test signal. One or both of the bandwidth of the signal and the amplitude of the signal may be adjustable. It may be desired to adjust the amplitude and bandwidth of the impulse test signal to optimize the test for a specific structure to be tested or to make sure that the test signal reaches the specific structure. As explained previously, the bandwidth of the impulse test signal can be adjusted by adjusting a slope of a step function used to generate the impulse test signal. The amplitude of the impulse test signal can be adjusted by changing the gain of the amplifier circuit.

In some embodiments, the signal generator circuit 830 of FIG. 8 includes a port 875 to receive an indication of one or both of the bandwidth of the impulse test signal and the amplitude of the impulse test signal, and the signal generator circuit 830 adjusts one or both of the amplitude and bandwidth accordingly. In certain embodiments, the port 875 receives input from user interface. In certain embodiments the port 875 receives input from a control circuit 880. In certain embodiments, the signal generator circuit 830 receives distance information via the port and automatically adjusts one or both of the signal amplitude and the signal bandwidth based on the indicated distance.

Figure 12:
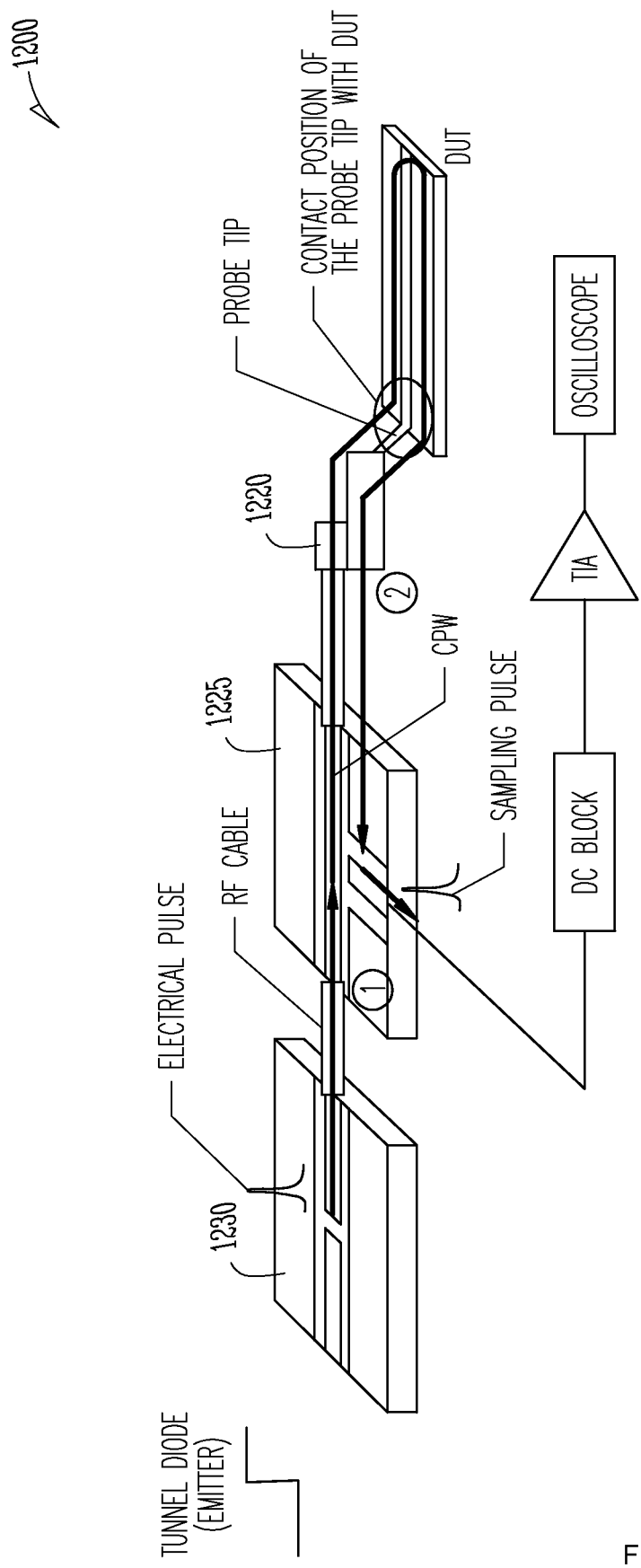
FIG. 12 is a block diagram of portions of an embodiment of a system to isolate defects in a device under test.

FIG. 12 is a block diagram of portions of an embodiment of a system to isolate defects in a DUT. The system 1200 includes a signal generator unit 1230, a signal router unit 1255, and a test probe 1220. The test probe 1220 may be included in a testing probe station that holds the DUT. The system applies an impulse test signal to the DUT and senses a reflected signal to detect detects in the DUT. The signal generator unit 1230 may generate a step function signal and convert the step function signal into the impulse test signal. In certain embodiments, the signal generator unit 1230 generates the step function signal using a tunnel diode circuit and converts the step function signal into an impulse test signal using a signal differentiator circuit.

The arrows in FIG. 12 indicate the routing of the impulse test signal and the sensed reflected signal. The signal router unit 1255 may include a signal sensor circuit and a signal divider circuit. The signal router unit 1255 is electrically coupled to the signal generator unit 1230 and the test probe 1220, such as by RF compatible cables for example. The signal router unit 1255 receives the impulse test signal from the signal generator unit 1230 and provides the signal to the test probe 1220 which applies the signal to the DUT. The reflected signal is sensed by the test probe 1220 and the signal router circuit 1255 routes the signal to the system receive path. In the example of FIG. 12, the receive path provides the reflected signal to an oscilloscope. In some embodiments, the sensed reflected signal is provided to one or both of a signal sampling circuit and a defect detection circuit.

Figure 13:
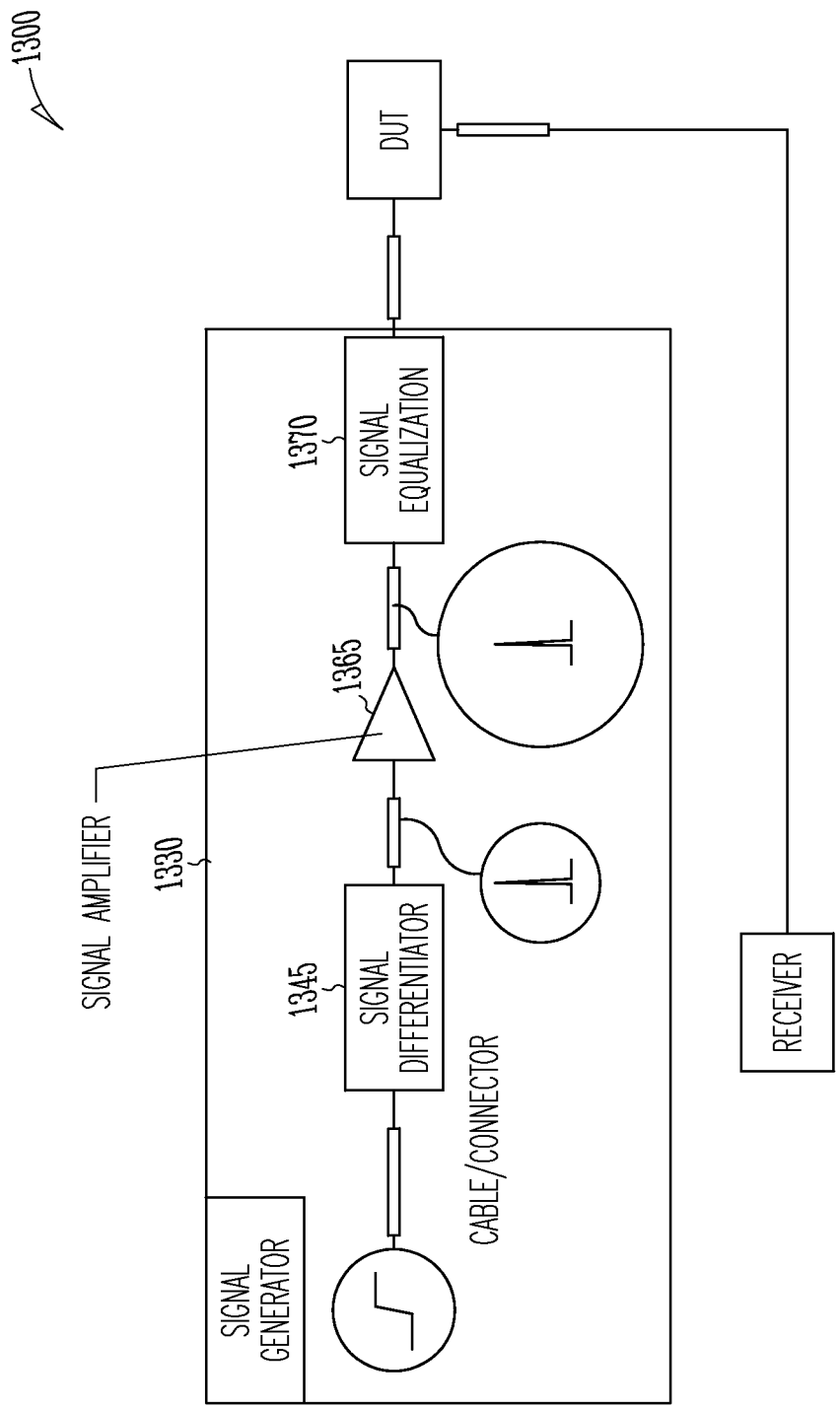
FIG. 13 is a block diagram of portions of another embodiment of a device to isolate defects in a device under test.

FIG. 13 is a block diagram of portions of another embodiment of a device 1300 to isolate defects in a DUT. In the embodiment, the impulse test signal is applied at a first location of the DUT using a test probe, and the conducted test signal is sensed using a sense probe at a second location of the DUT different from where the test probe applies the impulse test signal. The device 1300 includes a signal generator circuit 1330 that generates the impulse test signal. The signal generator circuit 1330 may include one or more of a signal differentiator 1345, an amplifier circuit 1365, and an equalizer circuit 1370. The sensed conducted signal is provided to a signal receiver that may include a sensor circuit and a defect detection circuit.

Figure 14:
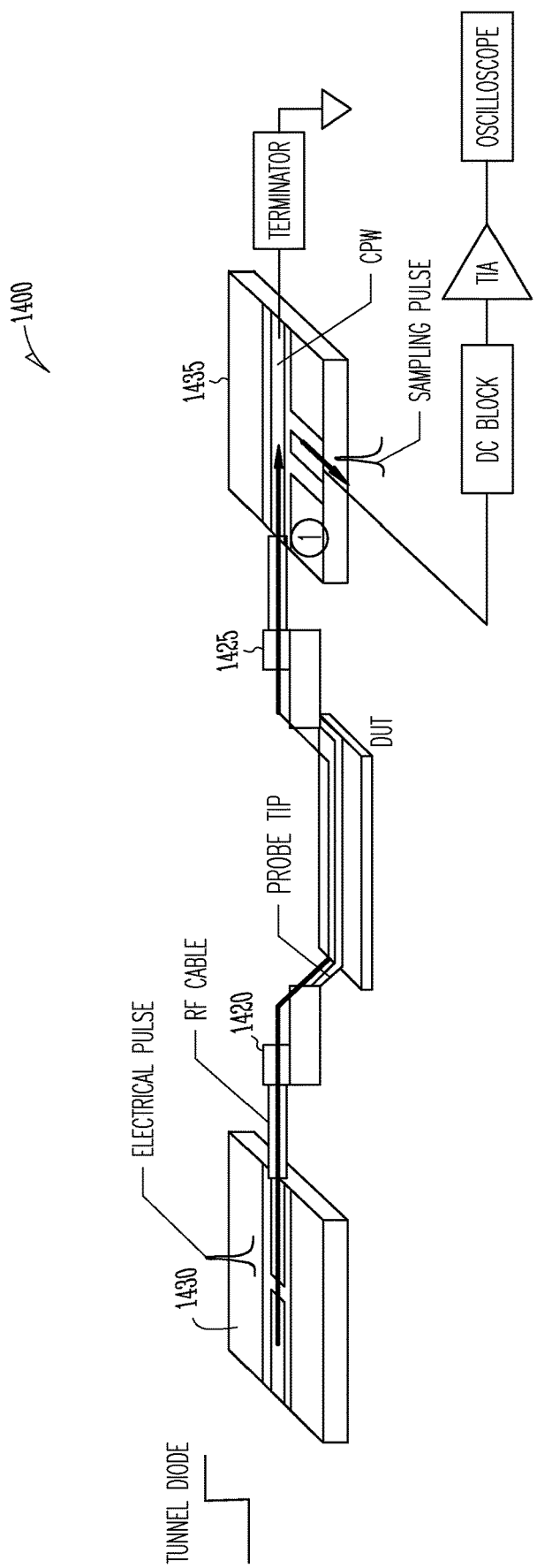
FIG. 14 is a block diagram of portions of another embodiment of a system to isolate defects in a device under test.

FIG. 14 is a block diagram of portions of an embodiment of a system to isolate defects in a DUT. The system 1400 includes a signal generator unit 1430, a test probe 1420, and a sense probe 1425. As in FIG. 12, the arrows in FIG. 14 show the routing of the impulse test signal and the sensed reflected signal. The signal generator unit 1430 provides the impulse test signal to the test probe 1420 which applies the test signal to the DUT. The impulse test signal is conducted through at least a portion of the DUT and is sensed with the sense probe 1425. The sense probe 1425 may be electrically coupled to a signal sensor unit 1435. In the example shown in FIG. 14, the signal sensor unit 1435 senses the signal transmitted and conducted through at least a portion of the DUT and provides the sensed signal to an oscilloscope. In some embodiments, the sensed conducted signal is provided to one or both of a signal sampling circuit and a defect detection circuit. The signal sensor unit 1435 may include an amplifier circuit to amplify signals sensed by the sense probe 1425.

In some embodiments, a defect in a DUT is detected by comparison to a reference signal representative of a device without defect. The defect detection circuit can include a comparison circuit to compare a sensed conducted signal waveform to a reference signal waveform. The comparison circuit may detect a defect when the sampled values of the sensed conducted signal differ from the sampled values of the reference signal waveform by more than specified threshold signal difference.

In some embodiments, the time of arrival of the impulse signal in the sensed conducted signal is used to determine whether there is a defect and to determine the location of the defect. Multiple conducted test signals are sensed at multiple locations of the DUT and received by the defect detection circuit. The defect detection circuit measures the delay in time of arrival of the impulse test signal at the multiple locations using the multiple sensed conducted test signals, and generates an indication of a location of the defect according to the measurements of delay in time of arrival.

Figure 15A:
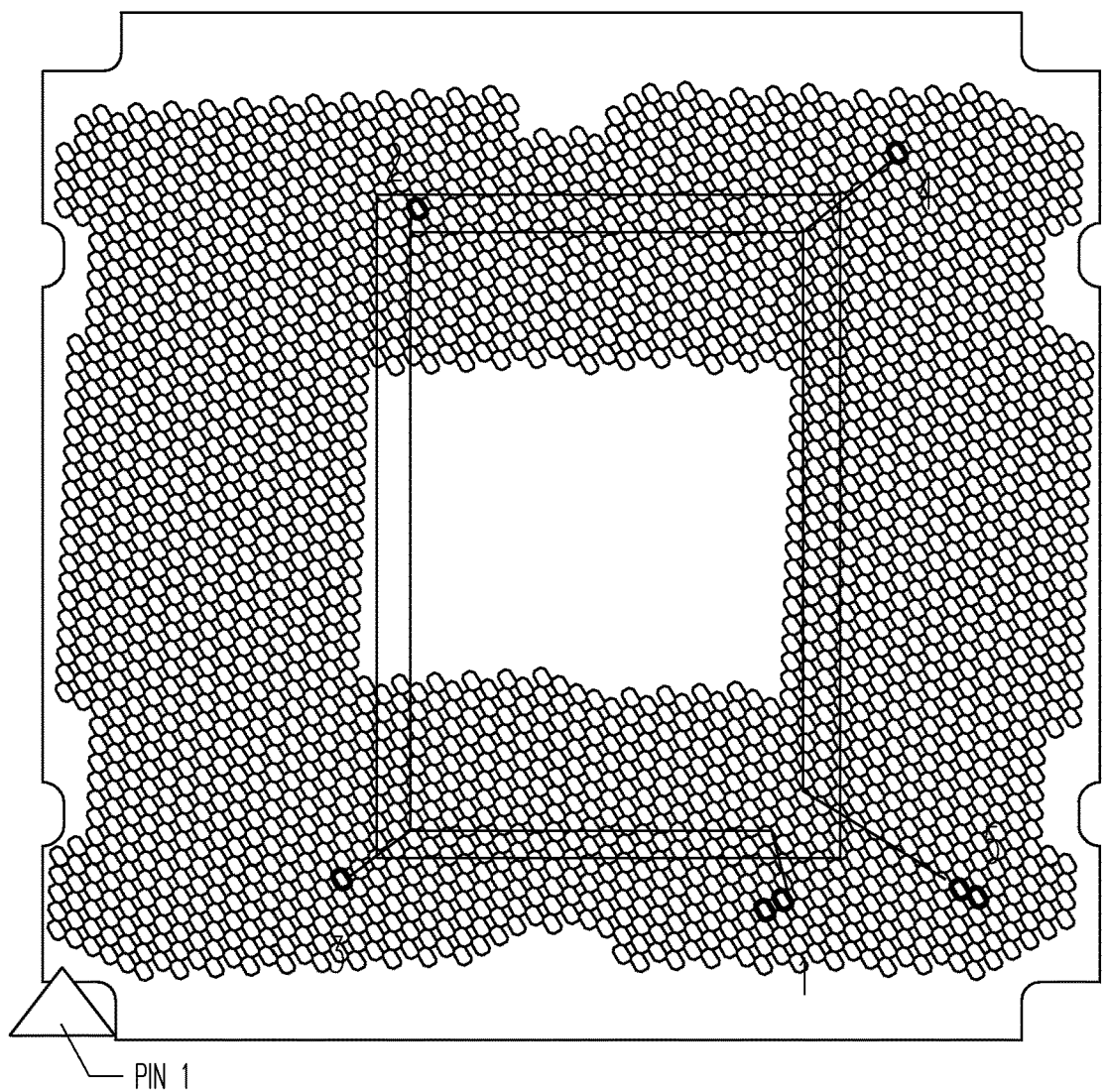
FIG. 15A illustrates an example of a device under test having multiple input-output pads.
Figure 15B:
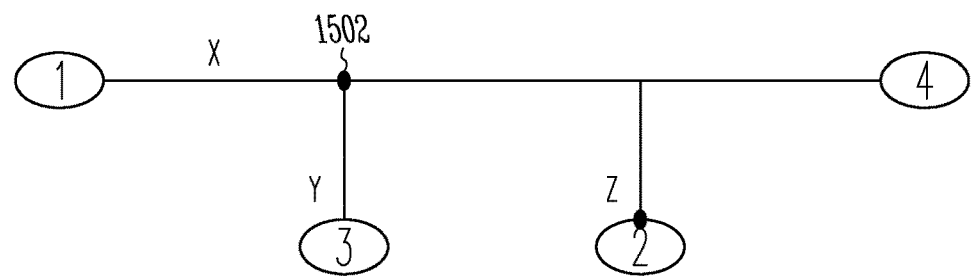
FIG. 15B shows a simplification of an electrical circuit for the device under test of FIG. 15A.

FIG. 15A illustrates a DUT having multiple input-output (I/O) pads. Five of the I/O pads are highlighted in the Figure and are used to describe the time of arrival analysis in detecting defects in the DUT. The I/O pads are electrically connected. FIG. 15B shows a simplification of the electrical circuit that includes the I/O pads labeled 1-4. Length "x" is the distance from I/O pad 1 to the node 1502, length "y" is distance from the node 1502 to I/O pad 3, and length "z" is the distance from node 1502 to I/O pad 2.

For the time of arrival analysis, an impulse test signal can be applied to the lengths $L_{13}$, $L_{12}$, and $L_{23}$, where $L_{13} = x + y$, $L_{12} = x + z$, and $L_{23} = y + z$.

Figure 16A:
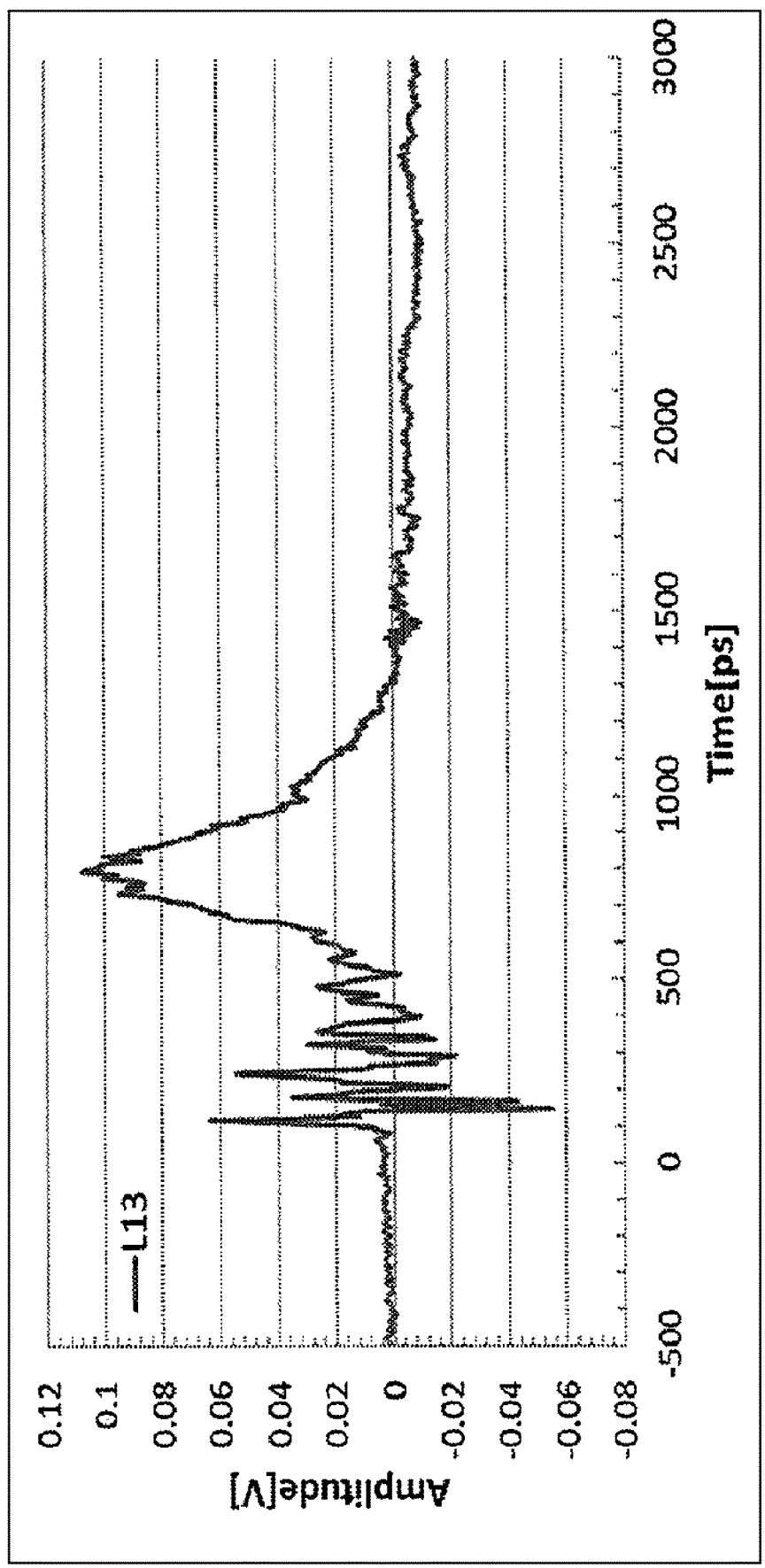
FIGS. 16A, 16B, 16C show examples of waveforms of sensed conducted test signals.
Figure 16B:
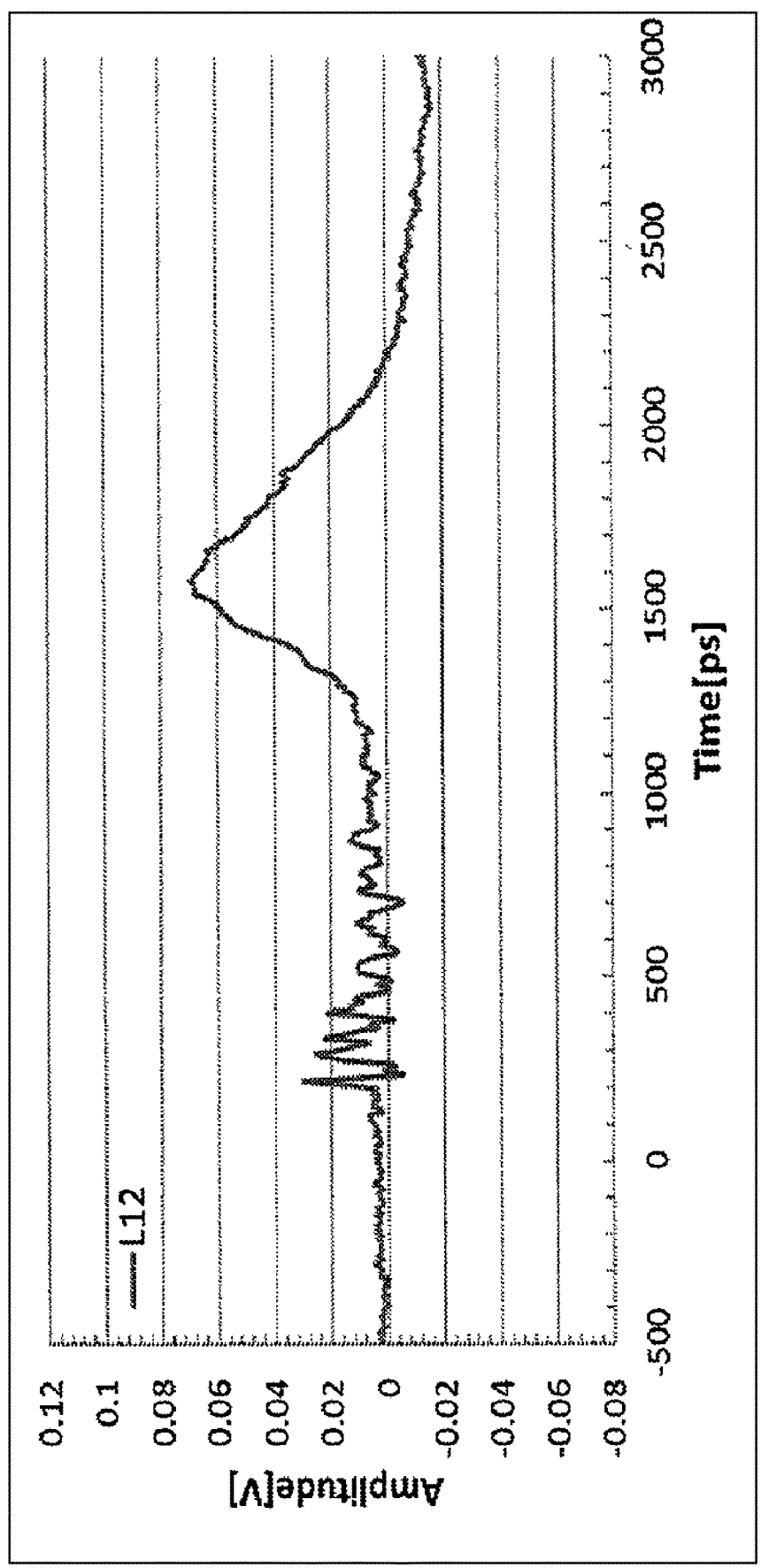
Figure 16C:
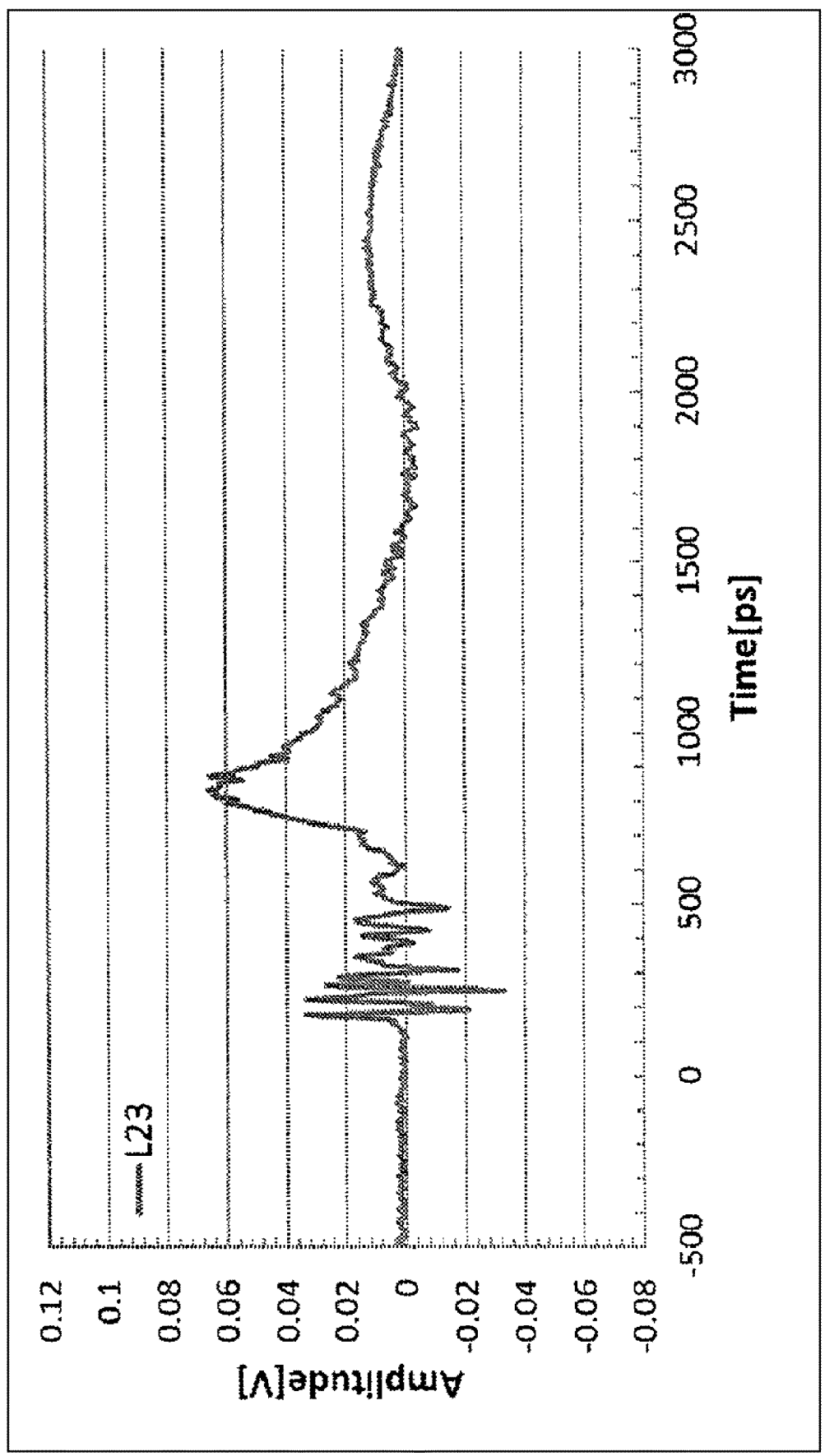

FIGS. 16A, 16B, 16C show waveforms for the sensed conducted test signals at the I/O pads for lengths $L_{13}$, $L_{12}$, and $L_{23}$, respectively. The waveforms represent the situation where there is a defect (e.g., an electrical short) at node 1502. The time to the peak value of the waveform of FIG. 16A is 795 ps, the time to the peak value of the waveform of FIG. 16B is 1575 ps, and time to the peak value of the waveform of FIG. 16C is 835 ps. The time to peak value can be used to determine the distance to the defect along the lengths $L_{13}$, $L_{12}$, and $L_{23}$. The following equations are derived from the equations above and can be used to determine the defect location (X, Y):

$X = (L_{12} + L_{13} - L_{23})/2$, and $Y = (L_{13} + L_{23} - L_{12})/2$.

Figure 17:
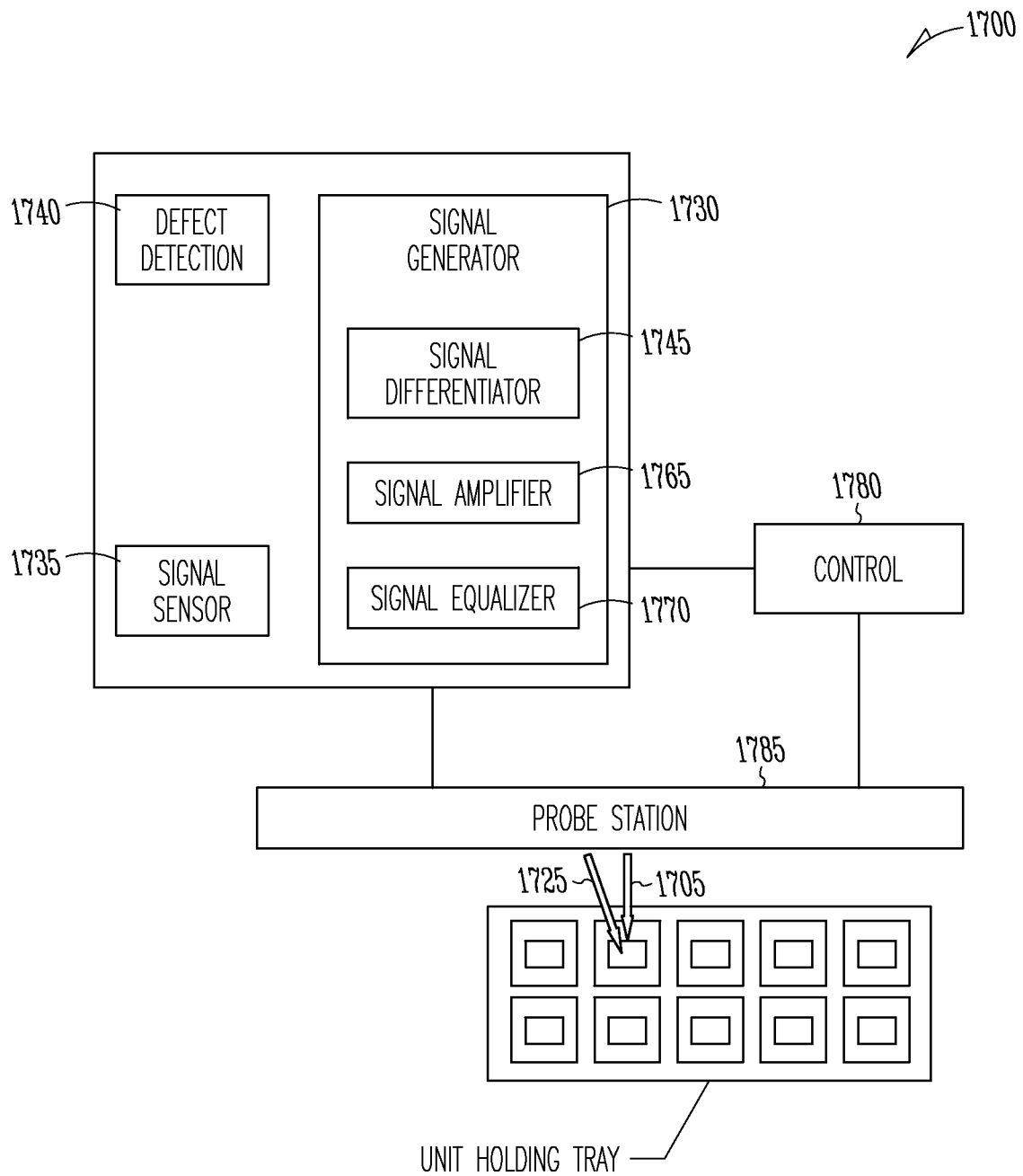
FIG. 17 is a block diagram of another embodiment of a system for detecting defects in a device under test.

FIG. 17 is a block diagram of another embodiment of a system for detecting defects in a DUT. The system 1700 includes a probe station 1785 that holds one or more DUTs and includes a test probe 1720 configured to apply an impulse test signal to the DUT. The system 1700 includes a signal generator circuit 1730 electrically coupled to the test probe 1720. The system 1700 also includes a signal sensor circuit 1735 and a defect detection circuit 1740. The signal generator circuit 1730 may include one or more of a signal differentiator 1745, a signal amplifier 1765, and a signal equalizer 1770.

In some embodiments, the system senses conducted test signals reflected to the test probe 1720 and analyzes the reflected test signals to detect defects in the DUT. In some embodiments, the system includes a sense probe 1725, and the system senses conducted test signals transmitted from the test probe 1720 through at least a portion of the DUT to the sense probe 1725 and analyzes the transmitted test signals to detect defects in the DUT. The test probe 1720 and sense probe 1725 can be manipulated by the probe station 1785 to different positions of the devices under test. In some embodiments, the system 1700 senses and analyzes both reflected and transmitted signals to detect defects. There may be some advantage to detecting some types of defects using reflected signals (e.g., open circuit defects) and detecting other types of defects using transmitted signals (e.g., short circuit defects).

The system may include a control circuit 1780 that provides control signals to the probe station 1785. The control circuit 1780 may provide control signals to select reflected signal based testing and transmitted signal based testing. In some embodiments, the control circuit 1780 that provides a control signal to the signal generator circuit 1730 to adjust a bandwidth of the impulse test signal according to a structure of the DUT to which the impulse test signal is applied. In some embodiments, the control circuit 1780 provides a control signal to the signal generator circuit 1730 to adjust a bandwidth of the impulse test signal according to a structure of the DUT to which the impulse test signal is applied. In some embodiments, the control circuit 1780 determines a distance between a structure of the DUT to be tested and a location of the DUT to which the impulse test signal is applied. For example, the control circuit 1780 may determine a distance between an I/O pad where the test probe applies the test signal and a structure such as a Si bridge in an electronic package being tested. The control circuit 1780 may adjust one or both of amplification and equalization based on the determined distance.

The embodiments described herein improve testing, debug, and failure analysis of complex electronic packages such as among other things processor units, chipsets, graphics processing units, and wireless devices without destructive analysis of the packages. Test customization and test signal analysis can provide feature-based fault detection and isolation.

ADDITIONAL DESCRIPTION AND EXAMPLES

Example 1 includes subject matter (such as an apparatus) comprising a signal generator circuit configured to generate an impulse test signal having an impulse waveform and adjust a bandwidth of the impulse test signal; a test probe electrically coupled to the signal generator circuit and configured to apply the impulse test signal to a device under test (DUT); a signal sensor circuit configured to sense a conducted test signal produced by applying the impulse test signal to the DUT with the test probe; and a defect detection circuit configured to generate an indication of a defect in the DUT using the conducted test signal.

In Example 2, the subject matter of Example 1 optionally includes a signal generator circuit configured to: generate a step function test signal having a step function waveform; generate the impulse test signal using a time derivative of the step function signal; and adjust a slope of the step function waveform of the step function test signal to set the bandwidth of the impulse test signal.

In Example 3, the subject matter of one or both of Examples 1 and 2 optionally includes a signal sensor circuit electrically coupled to the test probe and the sensed conducted signal is a reflected signal of the applied impulse test signal sensed using the test probe.

In Example 4, the subject matter of Example 3 optionally includes a defect detection circuit including a comparison circuit configured to compare the sensed reflected signal to a reference reflection signal expected from a DUT without defect; and generate the indication of the defect according to the comparison.

In Example 5, the subject matter of one or both of Examples 3 and 4 optionally includes a defect detection circuit including a comparison circuit configured to: compare a sensed reflected signal waveform to a reference signal waveform; and detect a time position that the sensed reflected signal waveform differs from the reference signal waveform, wherein the defect detection circuit is configured to generate an indication of a location of the defect according to the detected time position.

In Example 6, the subject matter of one or both of Examples 1 and 2 optionally includes a sense probe electrically coupled to the signal sensor circuit and configured to sense the conducted test signal at a location of the DUT different from a location of the DUT where the test probe applies the impulse test signal.

In Example 7, the subject matter of Example 6 optionally includes a defect detection circuit configured to: receive multiple conducted test signals sensed at multiple locations of the DUT; measure delay in time of arrival of the impulse test signal at the multiple locations using the multiple sensed conducted test signals; and generate an indication of a location of the defect according to the measurements of delay in time of arrival.

In Example 8, the subject matter of one or any combination of Examples 1-7 optionally includes a signal generator circuit including a port to receive an indication of the bandwidth of the impulse test signal and adjust the bandwidth according to the received indication.

In Example 9, the subject matter of one or any combination of Examples 1-8 optionally includes a signal generator circuit including a port to receive a distance value representative of a distance between a structure of the DUT to be tested and a location of the DUT where the impulse test signal is applied, and wherein the signal generator circuit is configured to adjust the bandwidth of the impulse test signal according to the received distance value.

In Example 10, the subject matter of one or any combination of Examples 1-9 optionally includes one or both of an amplifier circuit and an equalizer circuit, wherein the amplifier circuit is configured to increase the signal power of the impulse test signal to produce an amplified impulse test signal, and the equalizer circuit is configured to preserve a bandwidth of the impulse test signal in the amplified impulse test signal.

In Example 11, the subject matter of one or any combination of Examples 1-10 optionally includes a signal generator circuit including a port to receive a distance value representative of a distance between a structure of the DUT to be tested and a location of the DUT where the impulse test signal is applied, and wherein the signal generator circuit is configured to adjust amplification of the impulse test signal according to the determined distance.

Example 12 can include subject matter (such as a method, a means for performing acts, or a machine-readable medium including instructions that, when performed by the machine, cause the machine to perform acts), or can optionally be combined with the subject matter of one or any combination of Examples 1-11 to include such subject matter, comprising generating an impulse test signal, wherein the impulse test signal is an electrical signal having an impulse waveform; adjusting a bandwidth of the impulse test signal; applying the impulse test signal to a device under test (DUT) using a test probe; sensing a conducted test signal, wherein the conducted test signal is produced by applying the impulse test signal to the DUT and is conducted through at least a portion of the DUT; and generating an indication of a defect in the DUT using the conducted test signal.

In Example 13, the subject matter of Example 12 can optionally include generating a step function test signal, wherein the step function test signal is an electrical signal having a step function waveform; and producing a time derivative of the step function signal to generate the impulse test signal, wherein the adjusting a bandwidth of the impulse test signal includes adjusting a slope of the step function waveform of the step function test signal to set the bandwidth of the impulse test signal.

In Example 14, the subject matter of one or both of Example 12 and 13 optionally includes sensing a reflected signal of the applied impulse test signal using the test probe.

In Example 15, the subject matter of Example 14 optionally includes comparing the sensed reflected signal to a reference reflection signal expected from a DUT without defect; and detecting a defect when the sensed reflected signal differs from the reference reflection signal by more than a threshold signal difference.

In Example 16, the subject matter of one or both of Examples 14 and 15 optionally includes comparing a sensed reflected signal waveform to a reference signal waveform, and wherein generating the indication of a defect in the DUT includes generating an indication of a location of the defect according to a time position that a waveform of the sensed reflected signal differs from the reference signal waveform.

In Example 17, the subject matter of one or both of Examples 12 and 13 optionally includes applying the impulse test signal at a first location of the DUT using the test probe, and wherein sensing a conducted test signal includes sensing the conducted test signal at a second location of the DUT using a sense probe.

In Example 18, the subject matter of Example 17 optionally includes sensing multiple conducted test signals at multiple locations of the DUT; and measuring delay in time of arrival of the impulse test signal at the multiple locations using the multiple sensed conducted test signals, wherein the generating an indication of a defect in the DUT includes generating an indication of a location of the defect according to the measurements of delay in time of arrival.

In Example 19, the subject matter of one or any combination of Examples 12-18 optionally includes determining a distance between a structure of the DUT to be tested and a location of the DUT to which the impulse test signal is applied, and adjusting the bandwidth of the impulse test signal according to the determined distance.

In Example 20, the subject matter of one or any combination of Examples 12-19 optionally includes one or both of amplifying the impulse test signal to adjust amplitude of the impulse test signal applied to the DUT, and equalizing the amplified impulse test signal to preserve a bandwidth of the impulse test signal.

In Example 21, the subject matter of Example 20 optionally includes determining a distance between a structure of the DUT to be tested and a location of the DUT to which the impulse test signal is applied, and adjusting the amplification according to the determined distance.

Example 22 includes subject matter (such as a test system), or can be combined with the subject matter of one or any combination of Examples 1-21 to include such subject matter, comprising a probe station configured to hold a device under test (DUT) and including a test probe configured to apply an electrical signal to the DUT; a signal generator circuit electrically coupled to the test probe and configured to generate an electrical impulse test signal having an impulse waveform and adjust a bandwidth of the impulse test signal; a signal sensor circuit configured to sense a conducted test signal produced by applying the impulse test signal to the DUT with the test probe; and a defect detection circuit configured to generate an indication of a defect in the DUT using the conducted test signal.

In Example 23, the subject matter of Example 22 optionally includes a signal generator circuit is configured to: generate a step function test signal having a step function waveform; generate the impulse test signal using a time derivative of the step function signal; and adjust a slope of the step function waveform of the step function test signal to set the bandwidth of the impulse test signal.

In Example 24, the subject matter of one or both of Examples 22 and 23 optionally includes a signal sensor circuit electrically coupled to the test probe and the sensed conducted signal is a reflected signal of the applied impulse test signal sensed using the test probe.

In Example 25, the subject matter of one or both of Examples 22 and 23 optionally includes a probe station including a sense probe electrically coupled to the signal sensor circuit and configured to sense the conducted test signal at a location of the DUT different from a location of the DUT where the test probe applies the impulse test signal.

Example 26 can include subject matter (such as an apparatus), or can be combined with the subject matter of one or any combination of Examples 1-25 to include such subject matter, comprising means for generating an impulse test signal, wherein the impulse test signal is an electrical signal having an impulse waveform; means for adjusting a bandwidth of the impulse test signal; means for applying the impulse test signal to a device under test (DUT) using a test probe; means for sensing a conducted test signal, wherein the conducted test signal is produced by applying the impulse test signal to the DUT and is conducted through at least a portion of the DUT; and means for generating an indication of a defect in the DUT using the conducted test signal.

In Example 27, the subject matter of Example 26 can optionally include means for generating a step function test signal, wherein the step function test signal is an electrical signal having a step function waveform; and include means for producing a time derivative of the step function signal to generate the impulse test signal. The means for adjusting a bandwidth of the impulse test signal can optionally include means for adjusting a slope of the step function waveform of the step function test signal.

In Example 28, the subject matter of one or both of Examples 26 and 27 optionally includes means for sensing a reflected signal of the applied impulse test signal.

In Example 29, the subject matter of one or both of Examples 26 and 27 optionally includes means for applying the impulse test signal at a first location of the DUT, and means for sensing the conducted test signal at a second location of the DUT.

Example 30 can include, or can optionally be combined with any portion or combination of any portions of any one or more of Examples 1-29 to include, subject matter that can include means for performing any one or more of the functions of Examples 1-29, or a machine-readable medium including instructions that, when performed by a machine, cause the machine to perform any one or more of the functions of Examples 1-29.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Method examples described herein can be machine or computer-implemented at least in part. Some examples can include a computer-readable storage medium or machine-readable storage medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. The code can be tangibly stored on one or more volatile, non-transitory, or non-volatile tangible computer-readable media, such as during execution or at other times. Examples of these tangible computer-readable storage media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment. Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

What is claimed is:

1. An apparatus comprising:
   a signal generator circuit configured to generate an impulse test signal having an impulse waveform and adjust a bandwidth of the impulse test signal;
   a test probe electrically coupled to the signal generator circuit and configured to apply the impulse test signal to a device under test (DUT);
   a signal sensor circuit configured to sense a conducted test signal produced by applying the impulse test signal to the DUT with the test probe;
   a defect detection circuit configured to generate an indication of a defect in the DUT using the conducted test signal;
   an amplifier circuit configured to increase the signal power of the impulse test signal to produce an amplified impulse test signal; and
   an equalizer circuit configured to preserve a bandwidth of the impulse test signal in the amplified impulse test signal.

2. The apparatus of claim 1, wherein the signal generator circuit is configured to:
   generate a step function test signal having a step function waveform;
   generate the impulse test signal using a time derivative of the step function signal; and
   adjust a slope of the step function waveform of the step function test signal to set the bandwidth of the impulse test signal.

3. The apparatus of claim 1, wherein the signal sensor circuit is electrically coupled to the test probe and the sensed conducted signal is a reflected signal of the applied impulse test signal sensed using the test probe.

4. The apparatus of claim 3, wherein the defect detection circuit includes a comparison circuit configured to compare the sensed reflected signal to a reference reflection signal expected from a DUT without defect; and generate the indication of the defect according to the comparison.

5. The apparatus of claim 3, wherein the defect detection circuit includes a comparison circuit configured to: compare a sensed reflected signal waveform to a reference signal waveform; and detect a time position that the sensed reflected signal waveform differs from the reference signal waveform, wherein the defect detection circuit is configured to generate an indication of a location of the defect according to the detected time position.

6. The apparatus of claim 1, including a sense probe electrically coupled to the signal sensor circuit and configured to sense the conducted test signal at a location of the DUT different from a location of the DUT where the test probe applies the impulse test signal.

7. The apparatus of claim 6, wherein the defect detection circuit is configured to:
   receive multiple conducted test signals sensed at multiple locations of the DUT;
   measure delay in time of arrival of the impulse test signal at the multiple locations using the multiple sensed conducted test signals; and
   generate an indication of a location of the defect according to the measurements of delay in time of arrival.

8. The apparatus of claim 1, wherein the signal generator circuit includes a port to receive an indication of the bandwidth of the impulse test signal and adjust the bandwidth according to the received indication.

9. The apparatus of claim 1, wherein the signal generator circuit includes a port to receive a distance value representative of a distance between a structure of the DUT to be tested and a location of the DUT where the impulse test signal is applied, and wherein the signal generator circuit is configured to adjust the bandwidth of the impulse test signal according to the received distance value.

10. The apparatus of claim 1, wherein the signal generator circuit includes a port to receive a distance value representative of a distance between a structure of the DUT to be tested and a location of the DUT where the impulse test signal is applied, and wherein the signal generator circuit is configured to adjust amplification of the impulse test signal according to the determined distance.

11. A method of controlling operation of a testing device, the method comprising:
    generating an impulse test signal, wherein the impulse test signal is an electrical signal having an impulse waveform;
    adjusting a bandwidth of the impulse test signal;
    applying the impulse test signal to a device under test (DUT) using a test probe;
    sensing a conducted test signal, wherein the conducted test signal is produced by applying the impulse test signal to the DUT and is conducted through at least a portion of the DUT; and
    generating an indication of a defect in the DUT using the conducted test signal.

12. The method of claim 11, wherein the generating an impulse test signal includes:
    generating a step function test signal, wherein the step function test signal is an electrical signal having a step function waveform; and
    producing a time derivative of the step function signal to generate the impulse test signal,
    wherein the adjusting a bandwidth of the impulse test signal includes adjusting a slope of the step function waveform of the step function test signal to set the bandwidth of the impulse test signal.

13. The method of claim 11, wherein sensing a conducted test signal includes sensing a reflected signal of the applied impulse test signal using the test probe.

14. The method of claim 13, including comparing the sensed reflected signal to a reference reflection signal expected from a DUT without defect; and detecting a defect when the sensed reflected signal differs from the reference reflection signal by more than a threshold signal difference.

15. The method of claim 14, wherein the comparing the sensed reflected signal to a reference reflection signal includes comparing a sensed reflected signal waveform to a reference signal waveform, and wherein generating the indication of a defect in the DUT includes generating an indication of a location of the defect according to a time position that a waveform of the sensed reflected signal differs from the reference signal waveform.

16. The method of claim 11, wherein applying the impulse test signal includes applying the impulse test signal at a first location of the DUT using the test probe, and wherein sensing a conducted test signal includes sensing the conducted test signal at a second location of the DUT using a sense probe.

17. The method of claim 16, including:
    sensing multiple conducted test signals at multiple locations of the DUT; and
    measuring delay in time of arrival of the impulse test signal at the multiple locations using the multiple sensed conducted test signals, wherein the generating an indication of a defect in the DUT includes generating an indication of a location of the defect according to the measurements of delay in time of arrival.

18. The method of claim 11, wherein the adjusting a bandwidth of the impulse test signal includes: determining a distance between a structure of the DUT to be tested and a location of the DUT to which the impulse test signal is applied, and adjusting the bandwidth of the impulse test signal according to the determined distance.

19. The method of claim 11, including amplifying the impulse test signal to adjust amplitude of the impulse test signal applied to the DUT, and equalizing the amplified impulse test signal to preserve a bandwidth of the impulse test signal.

20. The method of claim 19, wherein the amplifying the impulse test signal includes determining a distance between a structure of the DUT to be tested and a location of the DUT to which the impulse test signal is applied, and adjusting the amplification according to the determined distance.

21. A test system comprising:
    a probe station configured to hold a device under test (DUT) and including a test probe configured to apply an electrical signal to the DUT;
    a signal generator circuit electrically coupled to the test probe and configured to generate an electrical impulse test signal having an impulse waveform and adjust a bandwidth of the impulse test signal;
    a signal sensor circuit configured to sense a conducted test signal produced by applying the impulse test signal to the DUT with the test probe;
    a defect detection circuit configured to generate an indication of a defect in the DUT using the conducted test signal; and
    wherein the probe station includes a sense probe electrically coupled to the signal sensor circuit and configured to sense the conducted test signal at a location of the DUT different from a location of the DUT where the test probe applies the impulse test signal.

22. The test system of claim 21, wherein the signal generator circuit is configured to:
    generate a step function test signal having a step function waveform;
    generate the impulse test signal using a time derivative of the step function signal; and
    adjust a slope of the step function waveform of the step function test signal to set the bandwidth of the impulse test signal.

23. The test system of claim 21, wherein the signal sensor circuit is electrically coupled to the test probe and the sensed conducted signal is a reflected signal of the applied impulse test signal sensed using the test probe.

* * * * *